US010882738B2

(12) United States Patent
Cachia et al.

(10) Patent No.: US 10,882,738 B2
(45) **Date of Patent: *Jan. 5, 2021**

(54) WAFER LEVEL PACKAGE FOR A MEMS SENSOR DEVICE AND CORRESPONDING MANUFACTURING PROCESS

(71) Applicant: STMICROELECTRONICS (MALTA) LTD, Kirkop (MT)

(72) Inventors: Conrad Cachia, Tarxien (MT); David Oscar Vella, Attard (MT); Damian Agius, San Gwann (MT); Maria Spiteri, Zejtun (MT)

(73) Assignee: STMICROELECTRONICS (MALTA) LTD, Kirkop (MT)

(*) Notice: Subject to any disclaimer, the term of this patent is extended or adjusted under 35 U.S.C. 154(b) by 0 days.

This patent is subject to a terminal disclaimer.

(21) Appl. No.: 16/547,093

(22) Filed: Aug. 21, 2019

(65) Prior Publication Data

US 2019/0375627 A1 Dec. 12, 2019

Related U.S. Application Data

(63) Continuation of application No. 15/725,190, filed on Oct. 4, 2017, now Pat. No. 10,435,290, which is a (Continued)

(30) Foreign Application Priority Data

Dec. 24, 2014 (IT) .............................. TO2014A1107

(51) Int. Cl.
*B61B 7/00* (2006.01)
*H01L 23/00* (2006.01)
(Continued)

(52) U.S. Cl.
CPC .......... *B81B 7/007* (2013.01); *B81C 1/00301* (2013.01); *H01L 24/97* (2013.01);
(Continued)

(58) Field of Classification Search
CPC ....... B81B 7/007; B81B 7/0048; B81B 7/008; B81C 1/00301; B81C 1/0023;
(Continued)

(56) References Cited

U.S. PATENT DOCUMENTS 6,613,606 B1 9/2003 Lee
7,335,986 B1 2/2008 Paek et al.
(Continued)

FOREIGN PATENT DOCUMENTS

CN 1789110 A 6/2006
CN 202102009 U 1/2012
(Continued)

*Primary Examiner* — Stephen M Bradley
*Assistant Examiner* — Gustavo G Ramallo
(74) *Attorney, Agent, or Firm* — Seed Intellectual Property Law Group LLP

(57) ABSTRACT

A MEMS device package comprising a first die of semiconductor material including a contact pad and a second die of semiconductor material stacked on the first die. The second die is smaller than the first die. The second die includes a contact pad, and a conductive wire is coupled between the contact pad of the first die and a contact pad of the second die. A mold compound is on the second die and the first die. A vertical connection structure is on the contact pad of the second die. The vertical connection structure extends through the mold compound.

20 Claims, 10 Drawing Sheets

Related U.S. Application Data continuation of application No. 14/860,157, filed on Sep. 21, 2015, now Pat. No. 9,802,813.

(51) Int. Cl.

| | |
|---|---|
| ***B81C 1/00*** | (2006.01) |
| ***B81B 7/00*** | (2006.01) |
| *H01L 23/31* | (2006.01) |

(52) U.S. Cl.

CPC . *B81B 2207/098* (2013.01); *B81C 2203/0154* (2013.01); *H01L 23/3121* (2013.01); *H01L 2224/04105* (2013.01); *H01L 2224/16145* (2013.01); *H01L 2224/16225* (2013.01); *H01L 2224/32145* (2013.01); *H01L 2224/32225* (2013.01); *H01L 2224/48145* (2013.01); *H01L 2224/48227* (2013.01); *H01L 2224/73204* (2013.01); *H01L 2224/73227* (2013.01); *H01L 2224/73265* (2013.01); *H01L 2224/92124* (2013.01); *H01L 2224/92164* (2013.01); *H01L 2224/94* (2013.01); *H01L 2224/97* (2013.01); *H01L 2924/0002* (2013.01); *H01L 2924/00012* (2013.01); *H01L 2924/181* (2013.01); *H01L 2924/18161* (2013.01)

(58) Field of Classification Search

CPC ............ B81C 1/00238; B81C 1/00253; B81C 1/00261; B81C 1/00333; H01L 2224/73101; H01L 24/63; H01L 21/76898; H01L 23/481; H01L 21/76802–76817; H01L 21/76877–76883

See application file for complete search history.

(56) References Cited

U.S. PATENT DOCUMENTS

| | | | | |
|---|---|---|---|---|
| 7,372,141 | B2 | 5/2008 | Karnezos et al. | |
| 7,923,790 | B1 | 4/2011 | Quevy et al. | |
| 8,669,143 | B2 | 3/2014 | Theuss | |
| 8,772,152 | B2 | 7/2014 | Co et al. | |
| 9,346,668 | B1 | 5/2016 | Dreiza et al. | |
| 9,546,089 | B1 * | 1/2017 | Hu | B81C 1/0023 |
| 9,824,975 | B2 | 11/2017 | Pagaila et al. | |
| 2006/0148137 | A1 | 7/2006 | Hartzell et al. | |
| 2008/0237883 | A1 | 10/2008 | Tago et al. | |
| 2008/0315333 | A1 * | 12/2008 | Combi | B81B 7/0061 257/415 |
| 2009/0278244 | A1 | 11/2009 | Dunne et al. | |
| 2010/0127340 | A1 | 5/2010 | Sugizaki | |
| 2010/0267182 | A1 | 10/2010 | Dungan et al. | |
| 2011/0227219 | A1 | 9/2011 | Alvarado et al. | |
| 2013/0001710 | A1 | 1/2013 | Daneman et al. | |
| 2013/0040423 | A1 | 2/2013 | Tung et al. | |
| 2013/0224914 | A1 | 8/2013 | Co et al. | |
| 2014/0130595 | A1 | 5/2014 | Zhao et al. | |
| 2014/0353775 | A1 | 12/2014 | Formosa et al. | |
| 2014/0353840 | A1 | 12/2014 | Yap et al. | |
| 2016/0185593 | A1 | 6/2016 | Cachia et al. | |
| 2016/0347609 | A1 * | 12/2016 | Yu | B81B 7/0006 |

FOREIGN PATENT DOCUMENTS

| | | | |
|---|---|---|---|
| CN | 205257992 | U | 5/2016 |
| EP | 145592 | A1 | 9/2004 |
| WO | 2014121090 | A1 | 8/2014 |

* cited by examiner

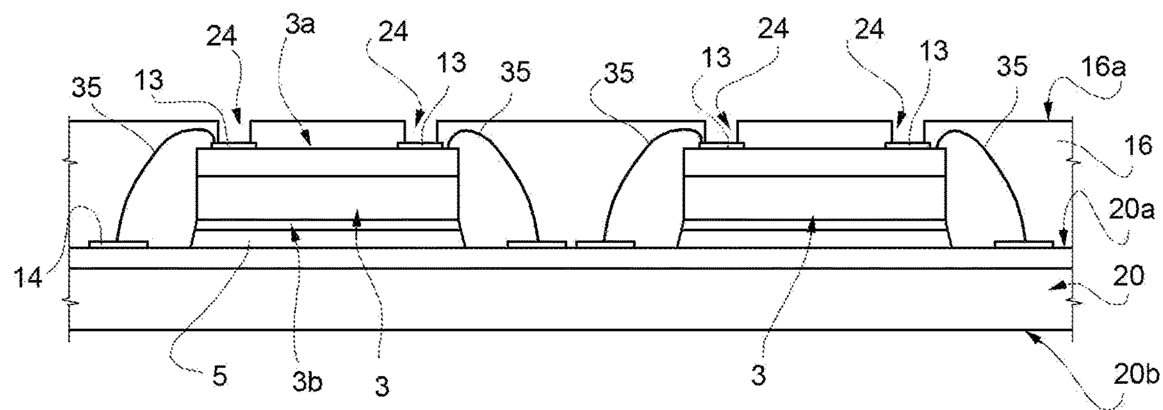
FIG. 16b
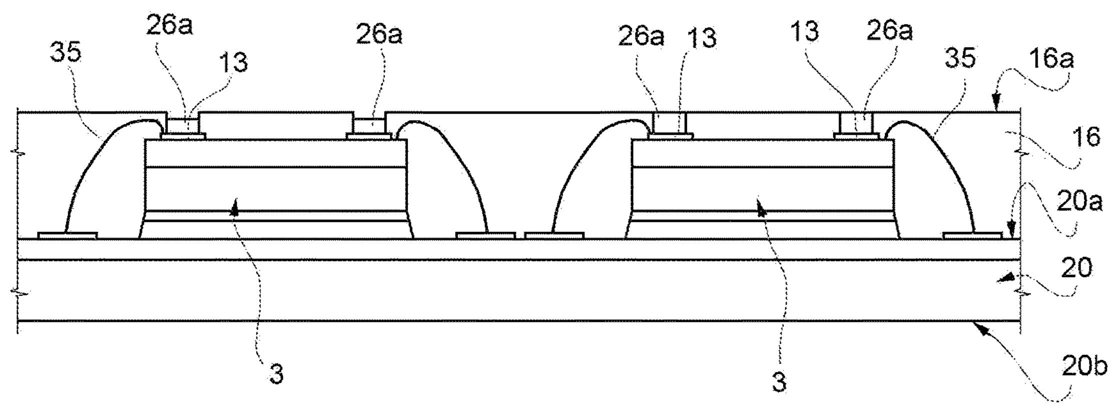
FIG. 16c
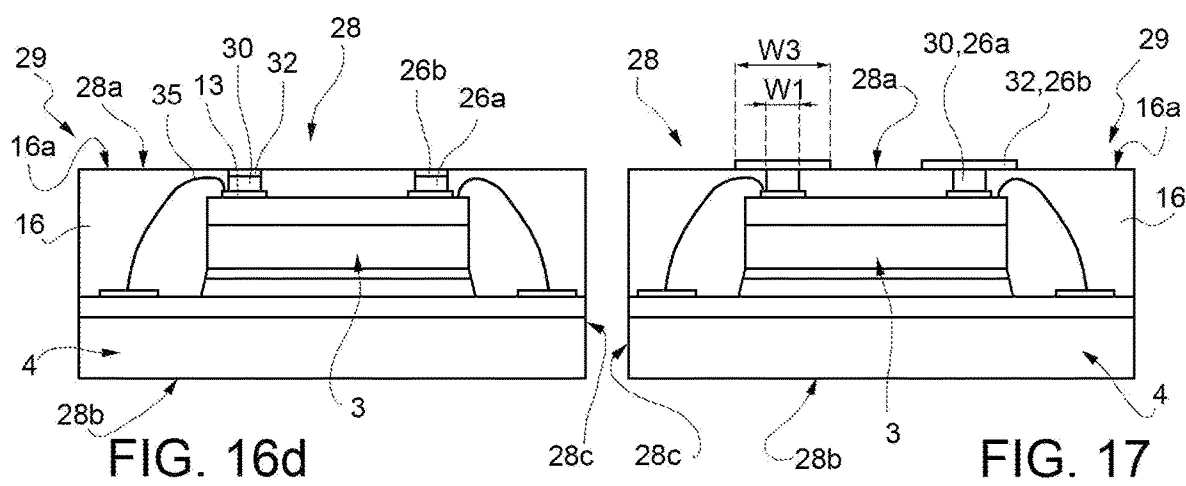
FIG. 16d
FIG. 17

WAFER LEVEL PACKAGE FOR A MEMS SENSOR DEVICE AND CORRESPONDING MANUFACTURING PROCESS

BACKGROUND

Technical Field

The present disclosure relates to a wafer level package for a microelectromechanical (MEMS) sensor device and to a corresponding manufacturing process.

Description of the Related Art

As it is known, current packages for MEMS sensor devices, such as accelerometers, gyroscopes, magnetometers, pressure or force sensors, follow a standard process flow of die-attach of dies to a substrate, wire bonding and encapsulation.

FIG. 1 shows an exemplary MEMS sensor device 1, with an LGA (Land Grid Array) package 2.

The MEMS sensor device 1 includes a first die 3, including semiconductor material, e.g., silicon, and including a structural layer 3' and an active layer 3", wherein a micromechanical sensing structure S is integrated and includes, for example, a membrane suspended over a cavity, an inertial mass, elastic elements and/or other micromechanical sensing parts.

First die 3 has a front surface 3*a*, defined by the active layer 3", at which the micromechanical sensing structure S is formed, and a back surface 3*b*, defined by the structural layer 3', opposite to the front surface 3*a* with respect to a vertical direction z (the first die 3 having a main extension in a horizontal plane xy, orthogonal to the vertical direction z). First die 3 may also integrate further mechanical or electronic components, depending on the applications.

The MEMS sensor device 1 also includes a second die 4, including semiconductor material, e.g., silicon, and including a respective structural layer 4' and a respective active layer 4", wherein an electronic circuit A (so called ASIC—Application Specific Integrated Circuit), is integrated, shown schematically and operatively coupled to the micromechanical sensing structure S, e.g., to process electrical signals generated in response to detected quantities (such as linear or angular accelerations, pressures or forces) and to provide processed output signals outside of the package 2.

Second die 4 has a respective front surface 4*a*, defined by the active layer 4", at which the ASIC circuit A is formed, and a back surface 4*b*, defined by the structural layer 4', opposite to the front surface 4*a*, with respect to vertical direction z.

The first and second dies 3, 4 are stacked in the vertical direction z, i.e., the first die 3 is arranged on the second die 4, with the back surface 3*b* of the first die attached to the front surface 4*a* of the second die 4, with the interposition of an adhesive layer 5 (or adhesive layers, as shown in the FIG. 1).

In the example, the second die 4 has a horizontal extension (in the horizontal plane xy, orthogonal to vertical direction z), that is larger than a corresponding horizontal extension of the first die 3.

Electrical connections between the first and second dies 3, 4 are made through wire bonding, with electrical wires 6 connecting first pads 7 carried by the front surface 3*a* of the first die 3 to second pads 8 carried by the front surface 4*a* of the second die 4 (arranged where the same front surface 4*a* of the second die 4 is not covered by the first die 3). In particular, the first pads 7 are electrically coupled to the micromechanical sensing structure S, while the second pads 8 are electrically coupled to the ASIC circuit A.

The MEMS sensor device 1 further includes a substrate 9, e.g., a multi-layered substrate includes stacked conductive and dielectric layers, which acts as a base and bottom external surface for the package 2.

The stack of the first and second dies 3, 4 is arranged on the substrate 9; in particular, the back surface 4*b* of the second die 4 is attached to a front surface 9*a* of the substrate 9 via a further adhesive layer 11 (or adhesive layers, as shown in FIG. 1).

Further electrical wires 12 connect third pads 13 carried by the front surface 4*a* of the second die 4 (and electrically coupled to the ASIC circuit A) to fourth pads 14 carried by the front surface 9*a* of the substrate 9 (arranged where the same front surface 9*a* is not covered by the stack of the first and second dies 3, 4).

A back surface 9*b* of the substrate 9 faces the outside of the package 2, and carries external connections to external devices, e.g., for soldering to an external printed circuit board (PCB) of an electronic apparatus (not shown), in which the MEMS sensor device 1 is integrated. In particular, the back surface 9*b* of the substrate 9 carries electrical connection elements, in the example in the form of conductive lands 15, and further electrical connections 15' are provided through the substrate 9 (so called TSV—Through Silicon Vias), for connecting the same conductive lands 15 to the fourth pads 14.

Other known solutions may envisage use of balls or spheres for electrical connection to an external printed circuit board (PCB); these packages are known as BGA, Ball Grid Array packages.

The MEMS sensor device 1 moreover includes a mold compound 16, e.g., of an insulating resin material, which covers and surrounds the stack of the first and second dies 3, 4 and moreover covers the front surface 9*a* of the substrate 9 (where the same front surface 9*a* is not covered by the stack of the first and second dies 3, 4). The electrical wires 6, 12 are embedded within the mold compound 16.

A front surface of the same mold compound defines a top external surface of package 2 of MEMS sensor device 1.

This standard package assembly, although advantageous in many respects, suffers from some drawbacks.

In particular, the package 2 has a dimension (especially in the vertical direction z) that may not be compatible with many applications, where size is an important design parameter, e.g., in portable or wearable electronic devices.

Moreover, the electrical wires 6, 12 may be subject to breaking during the molding process, this leading to failure of the manufactured MEMS sensor device 1.

In order to address these issues, some solutions have already been proposed, envisaging elimination of the substrate 9 (the so called wafer-level package), or the electrical connection between the first and second dies 3, 4 with the flip-chip technique, for achieving die bonding together with electrical connection.

However, an altogether satisfactory packaging solution for a MEMS sensor device, having reduced size (e.g., in the vertical direction) and desired mechanical and electrical performances continues to be desired.

In particular, important issues that remain outstanding are how to provide electrical connections to the outside of the package, e.g., for soldering to an external printed circuit board, without resorting to the use of complex and expensive manufacturing process steps.

BRIEF SUMMARY

One or more embodiments of the present disclosure may overcome, at least in part, the issues highlighted previously, and in particular to provide a packaging solution having reduced dimensions, a simple manufacturing process with reduced costs, and desired performances.

According to the present disclosure, a MEMS sensor device and a corresponding manufacturing process are thus provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 16*a*-16*d* show schematic cross sections of a MEMS sensor device in subsequent steps of a manufacturing process, according to yet another embodiment of the present solution;

FIG. 17 shows, in cross section, a possible variation of the manufactured MEMS sensor device;

DETAILED DESCRIPTION

As will be detailed in the following discussion, an aspect of the present solution envisages a wafer-level packaging of a first die and a second die of semiconductor material, without any substrate as the base of the package; in possible embodiments, the first and second dies are preferably coupled with a flip-chip connection, without bonding with electrical wires.

In particular, vertical connection structures are envisaged through the thickness of a mold compound, coating at least in part the stack of first and second dies, reaching up to the external surface of the mold compound.

Moreover, in order to provide electrical connections to the outside of the package, e.g., for soldering to an external printed circuit board, external electrical connection elements, e.g., in the form of lands, are envisaged at the external surface of the mold compound, connected to the vertical connection structures.

According to a particular aspect of the present solution, the external electrical connection elements are made of an adhesive solderable material, which adheres to the vertical connection structures and/or the mold compound and also offer desired solderability properties.

Various embodiments of the present solution will now be discussed in detail, in particular envisaging either a single material for the formation of the vertical connection structures and external electrical connection elements, or two different materials, a first material for the vertical connection structures and a second, different, material for the external electrical connection elements.

Figure 1:
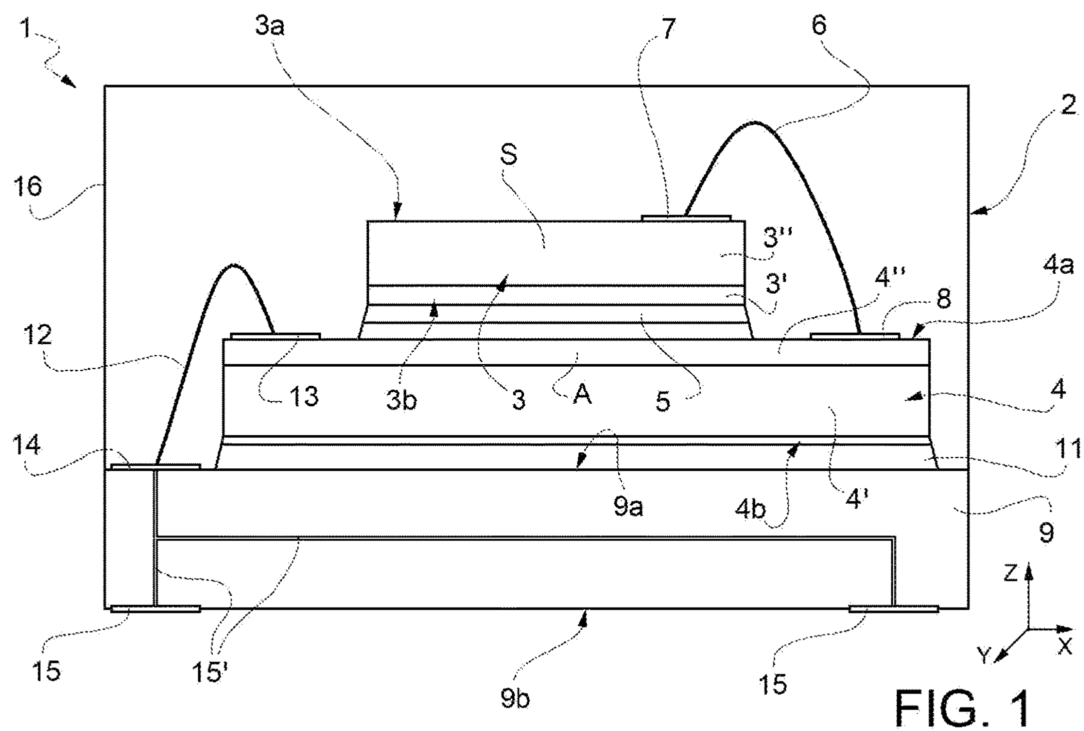
FIG. 1 shows a schematic cross section of a known MEMS sensor device, with an LGA package.
Figure 2A:
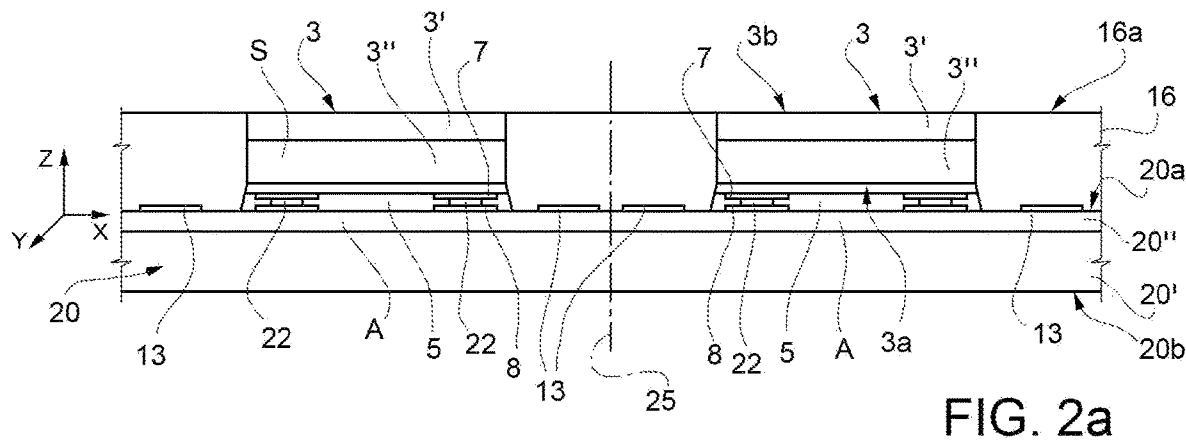
FIGS. 2*a*-2*d* show schematic cross sections of a MEMS sensor device with a wafer-level package in subsequent steps of a manufacturing process, according to an embodiment of the present solution.

A first embodiment of a manufacturing process according to the present solution is now discussed in more details, first with reference to FIG. 2*a*, which shows a pair of first dies 3 (same references are used to denote elements similar to those disclosed in connection with FIG. 1), which are attached adjacent one another on a same wafer 20, including semiconductor material, e.g., silicon. It will be clear, however that, at this stage of the manufacturing process, a plurality of first dies 3, each integrating a respective micromechanical structure S, are attached to the same wafer 20.

The wafer 20 includes a structural layer 20' and an active layer 20", which integrates a number of ASIC circuits A, one for each first die 3. The wafer 20 is designed to be sawn, or singulated, at the end of the manufacturing process, in order to form a number of MEMS devices, each with a respective second die 4, coupled to a respective first die 3 as will be shown in the following, for example in FIGS. 2*c* and 2*d*.

In particular, each first die 3 is attached to wafer 20 via the flip-chip technique, i.e., the front surface 3*a* of the first die 3 faces a respective front surface 20*a* of the wafer 20, which defines the active layer 20" and at which the ASIC circuits A are integrated.

Accordingly, electrical connection elements, e.g., in the form of conductive bumps 22, mechanically and electrically couple first pads 7 carried by the front surface 3*a* of the first die 3 to second pads 8 carried by the front surface 20*a* of the wafer 20 (as shown in FIG. 2*a* and the following Figures, a layer, e.g., a passivation layer, may be present at the front surface 3*a* of the first die 3, where the first pads 7 are not present). Conductive bumps 22 are embedded within adhesive layer 5, which is in this case interposed between the front surface 3*a* of the first die and the front surface 20*a* of the wafer 20.

No electrical wires are therefore envisaged for electrical connection between the micromechanical structure S integrated within the first die 3 and the respective ASIC circuit A integrated within wafer 20.

The front surface 20*a* of the wafer 20 moreover carries third pads 13, electrically coupled to the ASIC circuits A and designed for electrical connection to the outside of the package, in order to provide processed output signals; mold compound 16 coats the front surface 20*a* of the wafer 20, where not covered by the first dies 3.

In this embodiment, mold compound 16 does not cover the back surface 3*b* of the same first dies 3, defined by respective structural layers 3', but is flush therewith, so that the same back surface 3*b* is designed to define, together with the front surface 16*a* of the mold compound 16, a first external surface of the package. Analogously, the back surface of the wafer 20, defined by the respective structural layer 20', defines a second external surface of the package, opposite to the first external surface along vertical direction z.

Figure 2B:
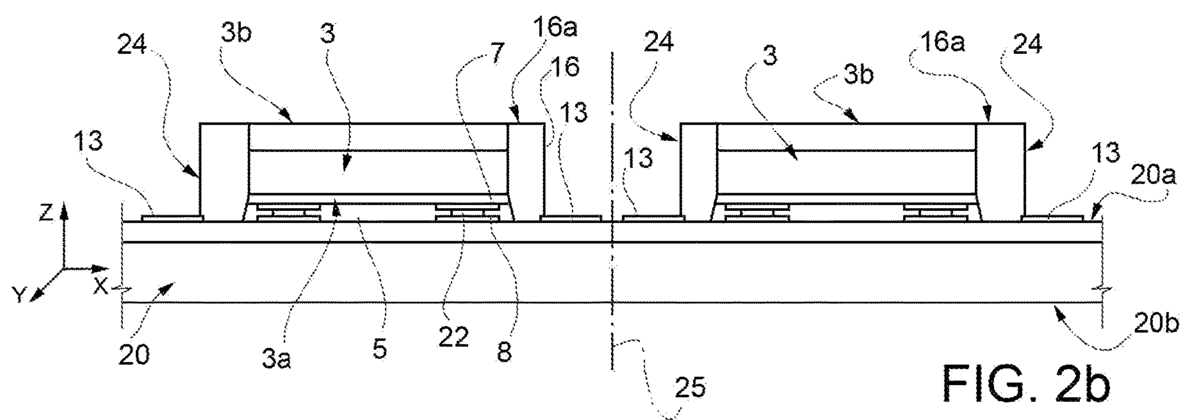

As shown in FIG. 2*b*, a subsequent step of the manufacturing process envisages formation of holes 24, extending for the whole thickness of the mold compound 16, from front surface 16*a* thereof to the front surface 20*a* of the wafer, exposing the third pads 13. The holes may be referred to as blind holes in that the holes do not extend through the wafer 20 and the third pads 13.

In particular, in this embodiment, each hole 24 exposes a pair of adjacent third pads 13 (each one electrically coupled to a respective ASIC circuit A, integrated within wafer 20, and coupled to a respective first die 3). Scribe lines 25, at which the wafer 20 is designed to be sawn to define the second dies 4, separate the two adjacent third pads 13 in each pair.

The holes 24 may be formed via laser removal of material (e.g., laser drilling), or other techniques, such as etching techniques through a suitable masking layer.

Figure 2C:
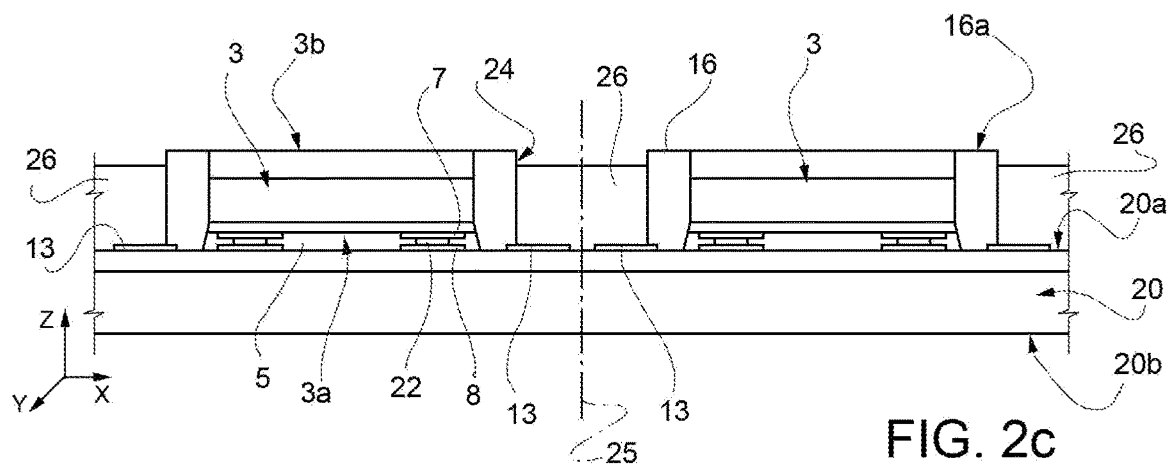

As shown in FIG. 2*c*, an electrical conductive material 26 is formed into the holes 24, e.g., via a dispensing process (so called "jetting"), a printing process with a suitable step to force the material into the hole, or any other suitable technique. Electrically conductive material 26 fills the holes 24, thus forming filled vias through the mold compound 16, which, in this embodiment, are recessed from the front surface 16*a* of the same mold compound 16.

Figure 2D:
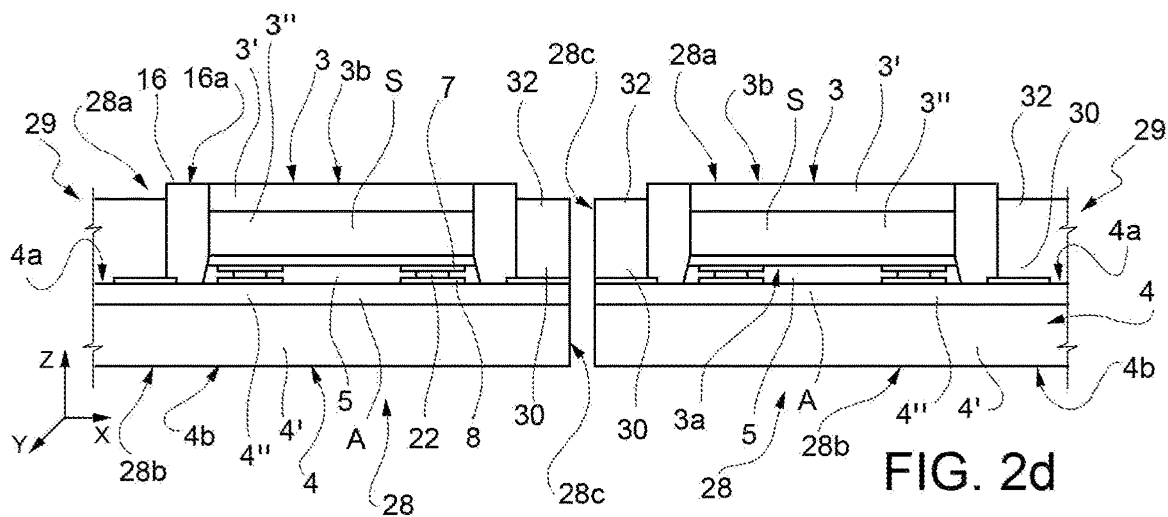

A subsequent step of the manufacturing process, as shown in FIG. 2*d*, envisages singulating the wafer 20, such as by sawing at the scribe lines 25, so as to define the second dies 4, and the stacking of a respective first die 3 on each of the same second dies 4.

Moreover, the same sawing operation defines a plurality of wafer-level packages 28 of MEMS devices 29.

In particular, in this embodiment, the same electrical conductive material 26 defines, within each hole 24, a vertical electrical connection structure 30 through the mold compound 16, and moreover an external electrical connection element 32, in the form of a land, in this case recessed from the front surface 16*a* of the same mold compound 16, accessible externally to the wafer-level package 28 in order to achieve electrical connection towards the second die 4(and/or the first die 3).

Figure 3:
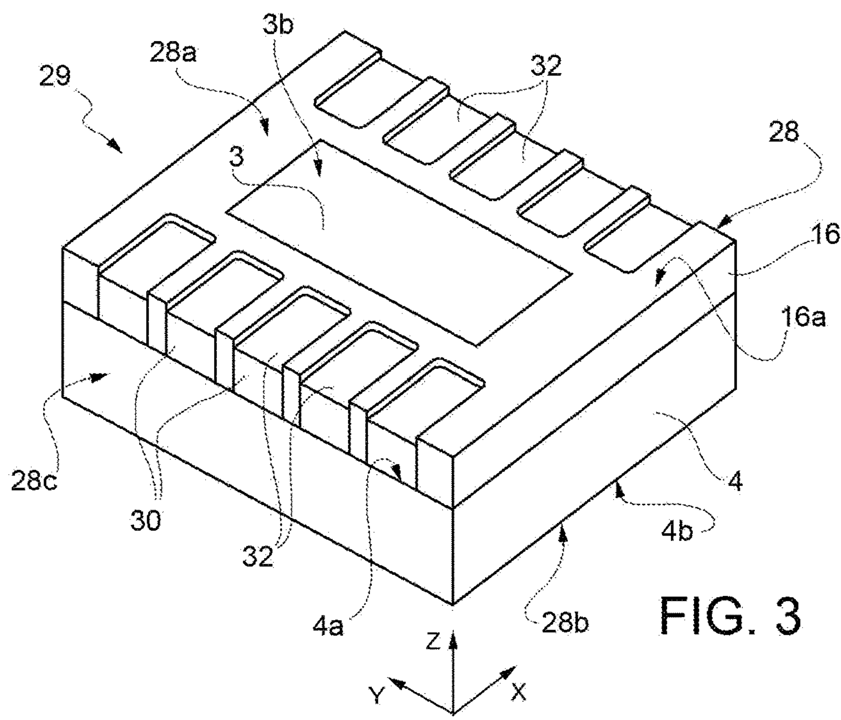
FIG. 3 is a perspective view of the MEMS sensor device, at the end of the manufacturing process.

FIG. 3 shows the singulated resulting MEMS device 29, provided with the wafer-level package 28, where an outer face 28*a* of the same wafer-level package 28 is defined together by the rear surface 3*b* of the first die 3 and the front surface 16*a* of the mold compound 16 (the external electrical connection element 32 being accessible from the same outer face 28*a*, recessed therefrom); and a further outer face 28*b* of the wafer-level package 28 is defined by the back surface 4*b* of the second die 4.

Moreover, in this embodiment, the vertical connection structure 30 is exposed to the outside of the wafer-level package 28, at lateral side surfaces 28*c* thereof, which are otherwise defined together by the mold compound 16 and the second die 4.

In more details, according to an aspect of the present solution, the electrical conductive material 26 is an adhesive solderable material, having one or more of the following properties: a desired adherence to the material of the mold compound 16, e.g., resin; a desired solderability, e.g., for connection to an external printed circuit board (here not shown) of an electronic apparatus integrating the MEMS device 29; desired reliability properties, for example even with temperature changes (in this case, the material being required to have low moisture adsorption and a coefficient of expansion compatible with the material of the same mold compound 16); and a low viscosity, in order to be able to flow within the holes 24 during the manufacturing process, possibly without air entrapment, thus reducing the risk of void formation (and the consequent decreased electrical connection properties). Depending on the particular applications, the electrical conductive material 26 may be required to have other properties; for example, aspects such as volume loss after curing could be relevant.

A further embodiment of the present solution is now discussed with reference to FIGS. 4*a*-4*c*.

Figure 4A:
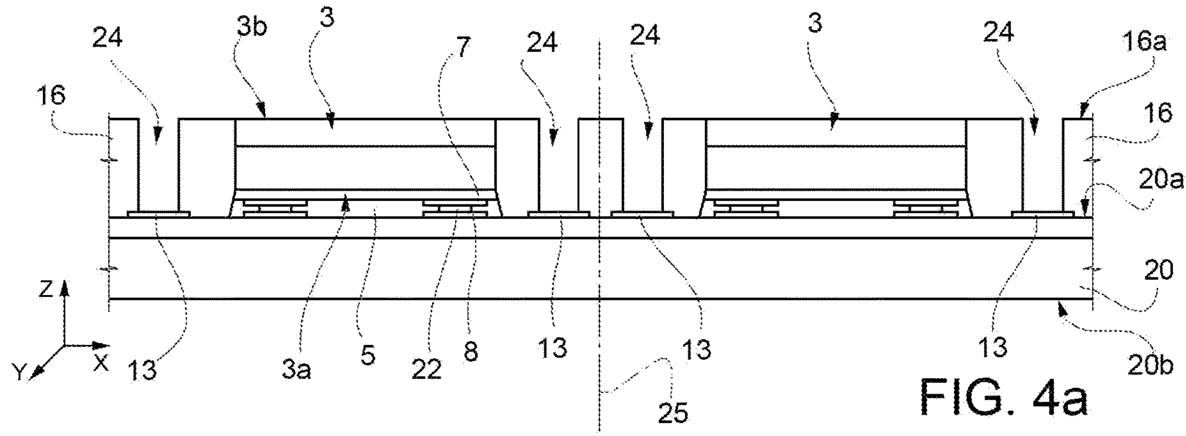
FIGS. 4*a*-4*c* show schematic cross sections of a MEMS sensor device in subsequent steps of a manufacturing process, according to another embodiment of the present solution.
Figure 4B:
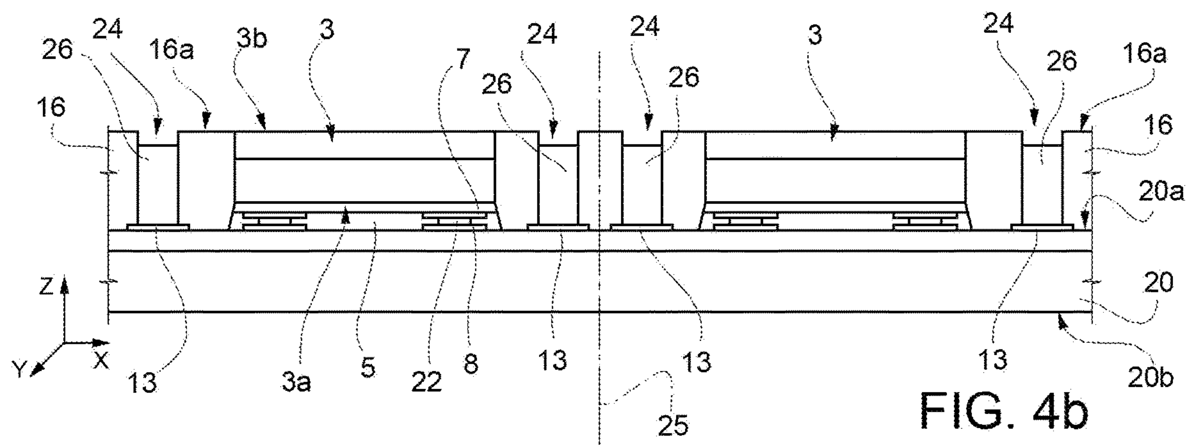

In particular, this embodiment differs from the one discussed with reference to FIGS. 2*a*-2*d* in that each hole 24, see FIG. 4*a*, is designed to expose a single third pad 13 (instead of a pair of adjacent third pads 13); in other words, individual holes 24 are formed above each third pad 13.

Figure 4C:
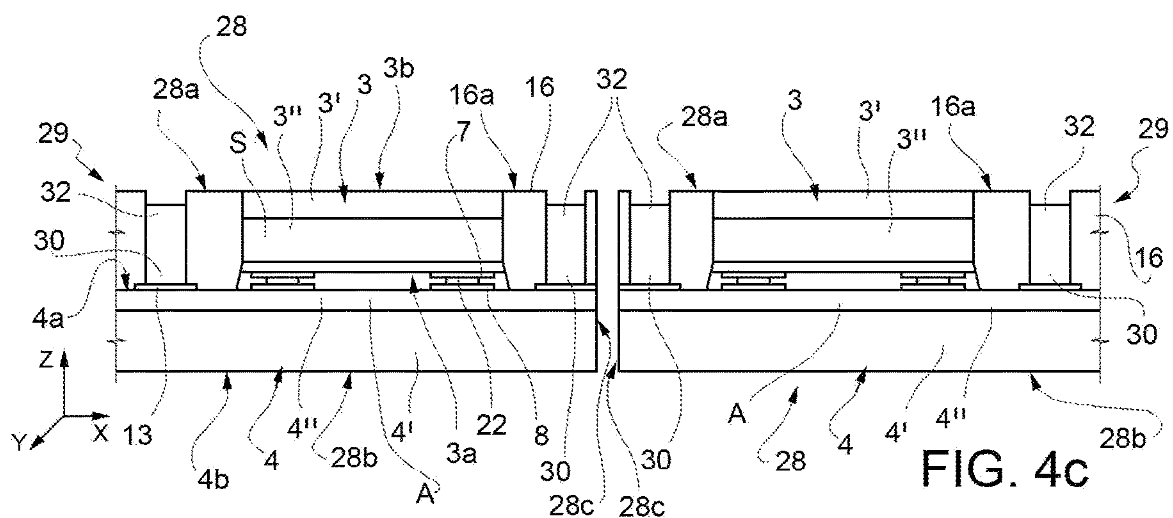

Accordingly, at the end of the manufacturing process, as shown in FIG. 4*c*, the vertical connection structure 30 in this case is not exposed to the outside of the wafer-level package 28, due to the remaining presence of the mold compound 16, which entirely defines, with the second die 4, the lateral side surface 28*c* of the wafer-level package 28.

Indeed, in this case, as shown in the same FIG. 4*c*, sawing is performed through the mold compound 16 arranged between adjacent holes 24, at scribe lines 25.

Figure 5A:
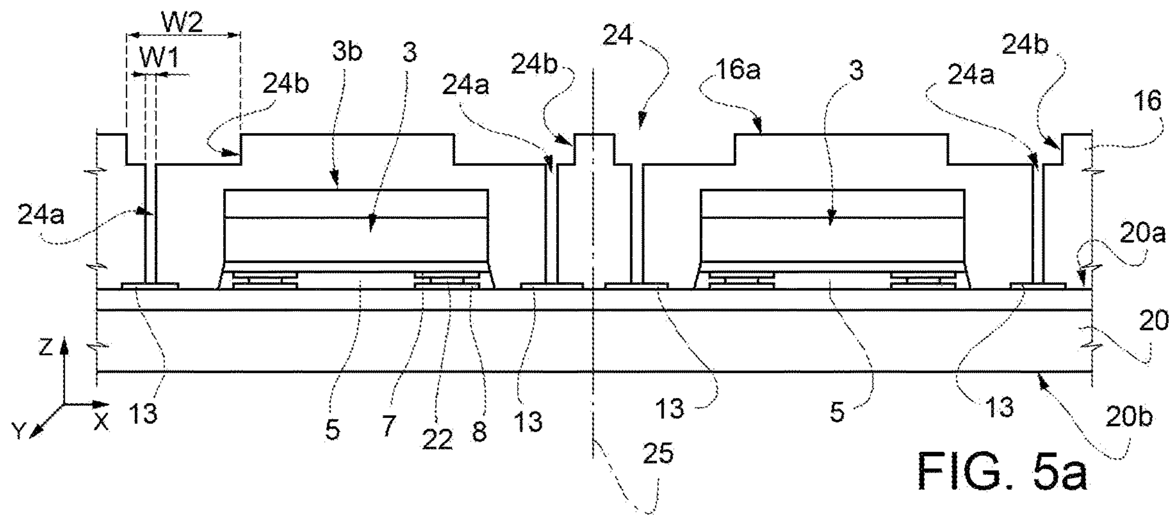
FIGS. 5*a*-5*c* show schematic cross sections of a MEMS sensor device in subsequent steps of a manufacturing process, according to yet another embodiment of the present solution.
Figure 5B:
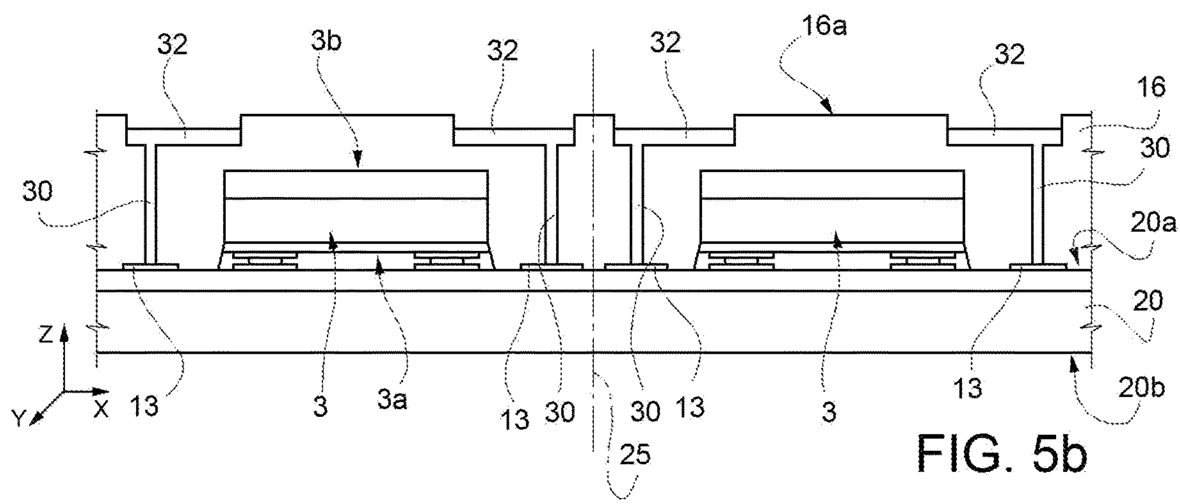
Figure 5C:
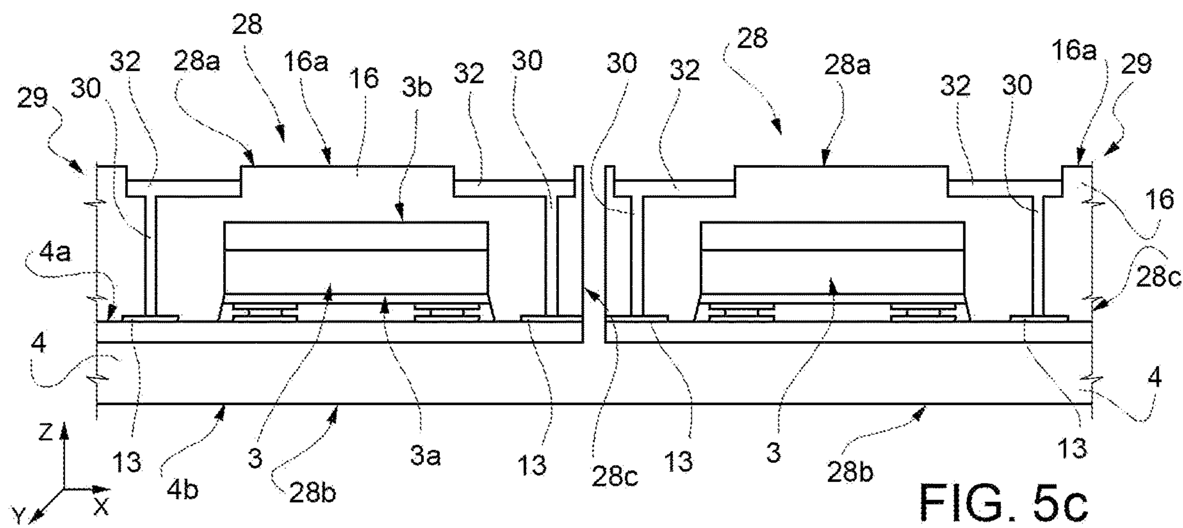

FIGS. 5*a*-5*c* relate to a still further embodiment of the present solution, which differs from the previously discussed embodiments in that holes 24 do not have a same diameter (or width) through the whole thickness of the mold compound 16.

As shown in FIG. 5*a*, each hole 24 includes: a first portion 24*a*, extending from the front surface 20*a* of the wafer 20 (and in this case exposing a single third pad 13), having a first width $W_1$; and a second portion 24*b*, fluidically coupled to the first portion 24*a* and extending up to the front surface 16*a* of the mold compound 16, having a second width $W_2$, larger than the first width $W_1$.

As it will be clear for a person skilled in the technical field, the holes 24 in this case result from a different formation step, e.g., from a two-step drilling process or etching process.

This solution may allow to better accommodate larger first dies 3, attached to the front surface 20*a* of the wafer 20, given a same overall size of the resulting wafer-level package 28.

In this case, as shown in FIGS. 5*b* and 5*c*, after filling of the holes 24 with the electrical conductive material 26, the external electrical connection elements 32 have the corresponding second width $W_2$, larger than the first width $W_1$ of the vertical connection structure 30.

Figure 6:
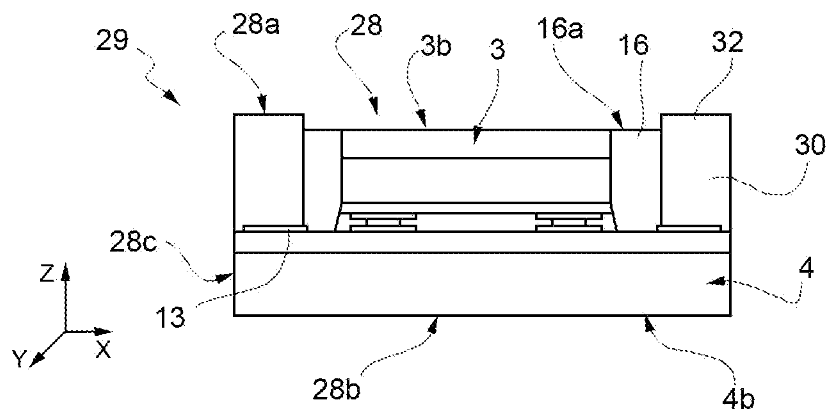
FIGS. 6-11 show, in cross section, possible variations of the manufactured MEMS sensor device.
Figure 7:
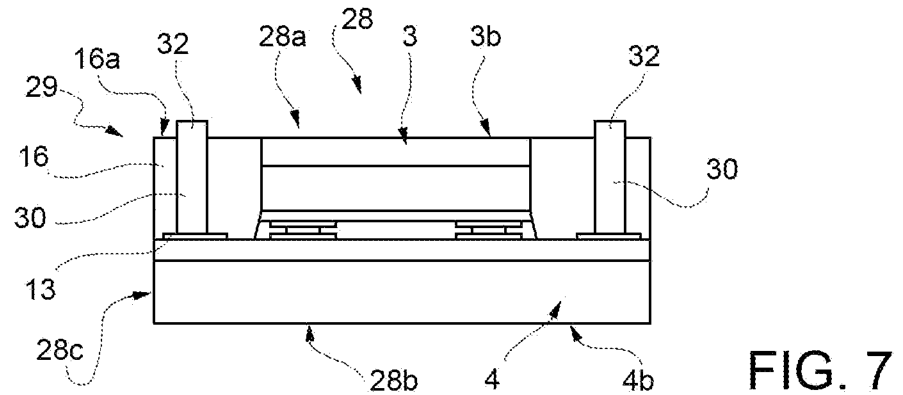
Figure 8:
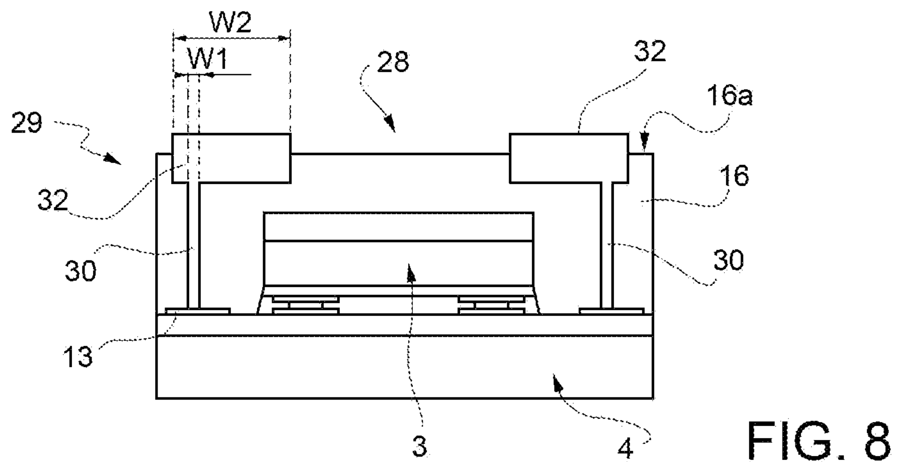

FIGS. 6-8 show first variations of the resulting wafer-level package 28, respectively with respect to the embodiment of FIGS. 2*d*, 4*c* and 5*c*, wherein the external electrical connection elements 32, instead of being recessed from the front surface 16*a* of the mold compound 16, are embossed from the same front surface 16*a* (this variation resulting from a different filling of the holes 24). In other words, the external electrical connection elements 32 stand at a higher level with respect to the front surface 16*a*, with respect to the vertical direction z.

Figure 9:
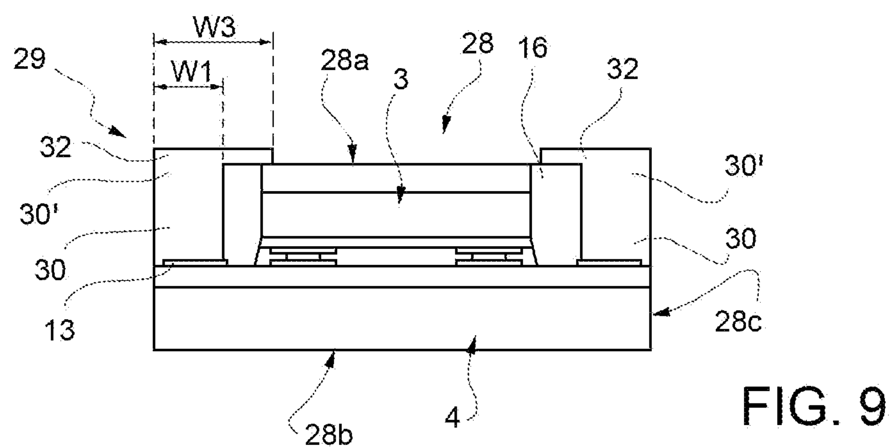
Figure 10:
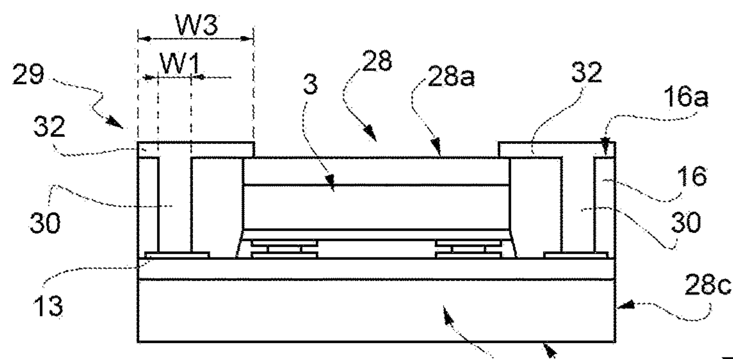
Figure 11:
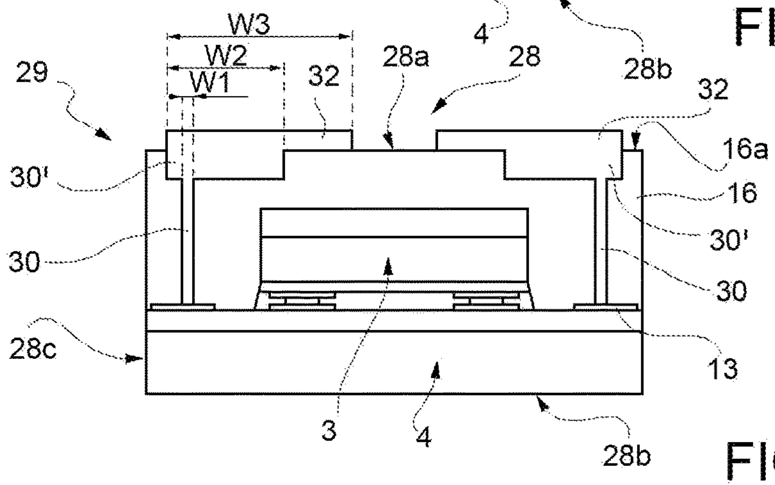

FIGS. 9-11 show second variations of the wafer-level package 28, wherein the external electrical connection elements 32 again are embossed with respect to the front surface 16*a* of the mold compound 16; moreover, in this case, the same external electrical connection elements 32 have a different width, denoted with $W_3$, larger than an underlying portion 30' of the vertical connection structure 30, having a width $W_1$ in the solutions of FIGS. 9 and 10, and a width $W_2$ (see the previous discussion) in the solution of FIG. 11.

Figure 12A:
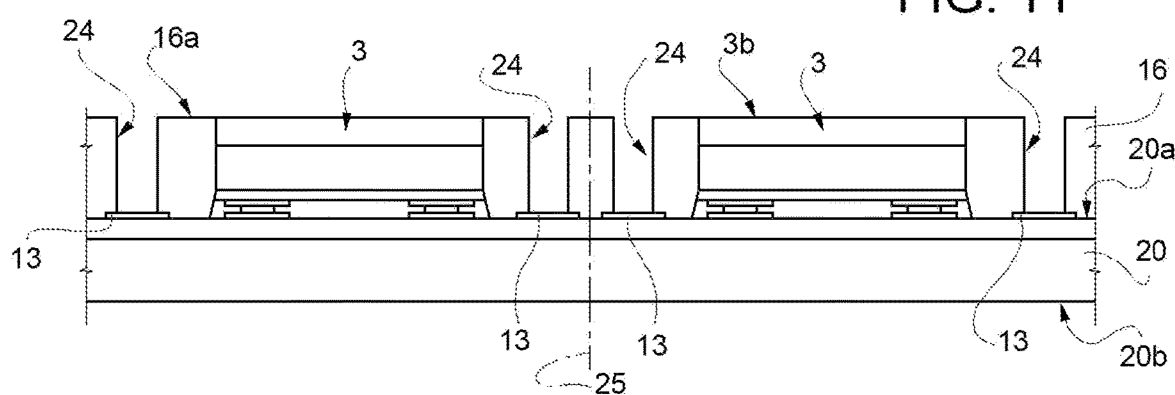
FIGS. 12*a*-12*c* show schematic cross sections of a MEMS sensor device in subsequent steps of a manufacturing process, according to yet another embodiment of the present solution.
Figure 12B:
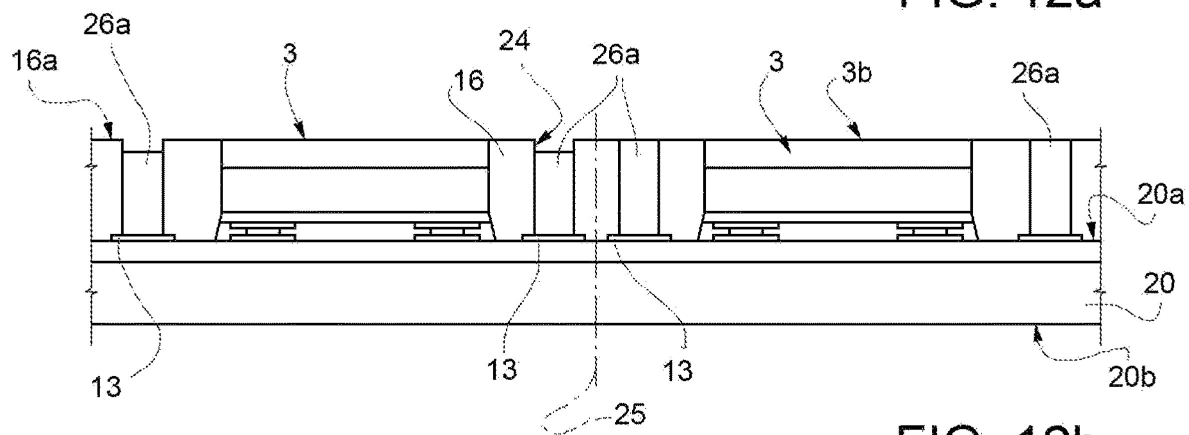
Figure 12C:
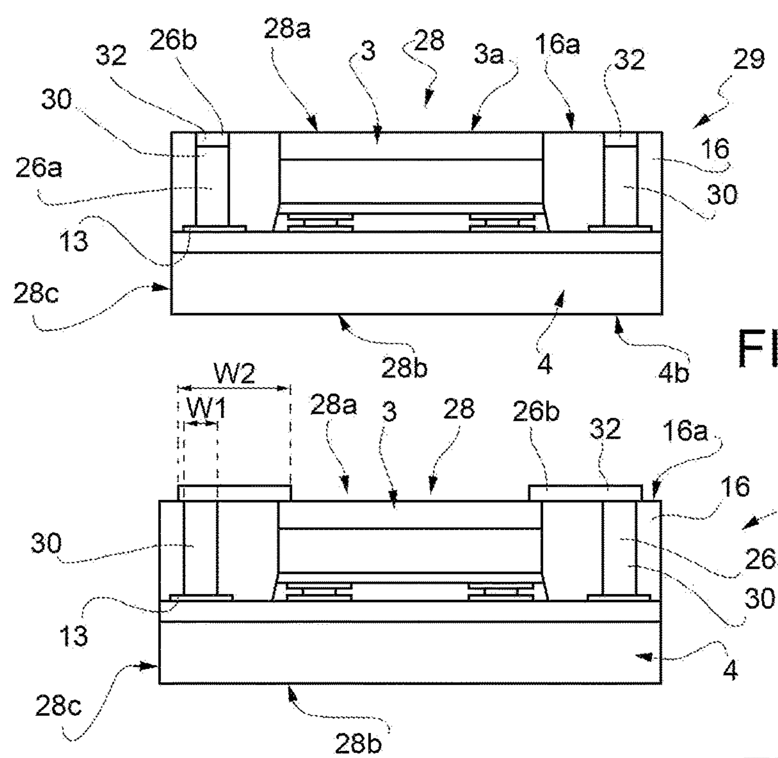

As shown in FIGS. 12*a*-12*c*, still a further embodiment of the present solution may envisage formation of the vertical connection structures 30 and the external connection elements 32, using two different materials.

In particular, after formation of the holes 24, as shown in FIG. 12*a* (in this example, one for each third pad 13), the same holes 24 are filled with a first conductive material, denoted with 26*a* in FIG. 12*b*, e.g., a conductive metal, a conductive resin, a first conductive adhesive material, or a plating material, in order to form the vertical connection structures 30.

As shown in FIG. 12*b*, filling may be flush with the front surface 16*a* (as shown for the right structure of FIG. 12*b*) of the mold compound 16, or instead the first conductive material 26*a* may be recessed from the same front surface 16*a* (as shown for the left structure in the same FIG. 12*b*).

Afterwards, as shown in FIG. 12*c* (showing the resulting MEMS device 29, after wafer singulation), the external connection elements 32 are formed, as lands on the previously formed vertical connection structures 30, using a second, different, electrical conductive material, here denoted with 26*b*.

As previously discussed, the second conductive material 26*b* is an adhesive solderable material, having the previously discussed electrical and mechanical properties.

Figure 13:
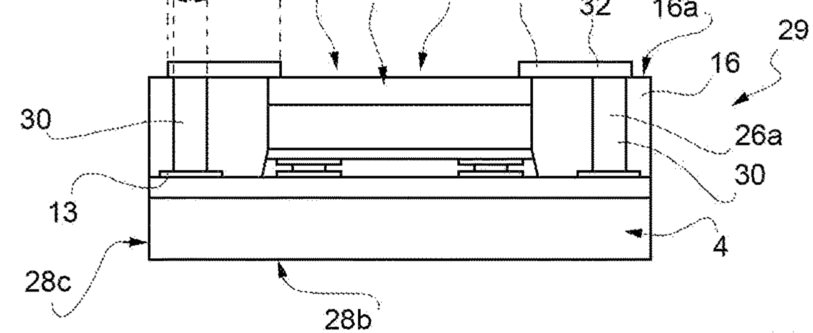
FIG. 13 shows, in cross section, a possible variation of the manufactured MEMS sensor device.

Moreover, the external connection elements 32 may have a same width $W_1$ as the underlying vertical connection structures 30, as shown in FIG. 12*c*, or a larger width, as shown in FIG. 13.

Figure 14A:
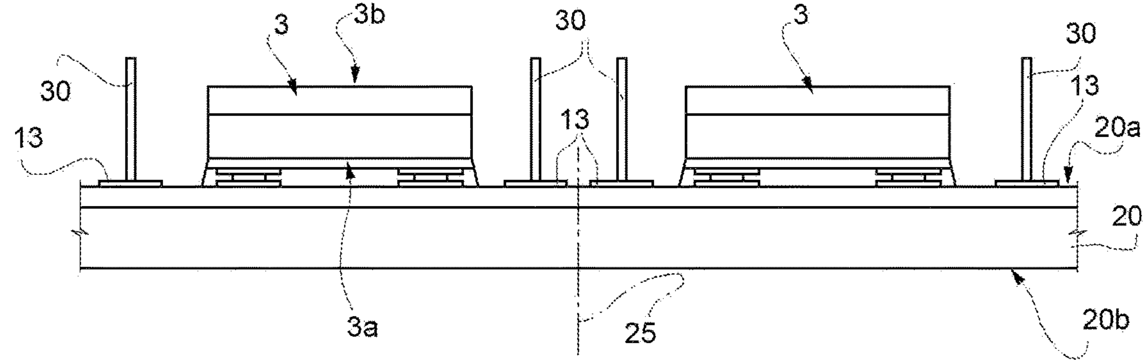
FIGS. 14*a*-14*c* show schematic cross sections of a MEMS sensor device in subsequent steps of a manufacturing process, according to yet another embodiment of the present solution.

A still further embodiment of the present solution is now discussed, first with reference to FIG. 14*a*, envisaging again use of two different conductive materials 26*a*, 26*b* for the formation of the vertical connection structures 30 and, respectively, of the external connection elements 32, and, moreover, an alternative solution for the formation of the same vertical connection structures 30.

In detail, and as shown in the same FIG. 14*a*, after the first dies 3 have been attached to the front surface 20*a* of the wafer 20, but before the formation of the mold compound 16, the vertical connection structures 30 are formed extending along the vertical direction z, starting from the front surface 20*a* of the same wafer 20, and in particular coupled, each to a respective third pad 13.

Formation of the vertical connection structures 30 may envisage known steps for manufacturing vertical wires (for example, as discussed in U.S. Pat. No. 8,772,152, or with any other known technique), or steps of vertically stacking a number of conductive bumps or pads or other conductive elements, of first conductive material 26*a*.

FIG. 14*a* schematically shows the vertical connection structures 30 resulting from the various possible manufacturing steps.

Figure 14B:
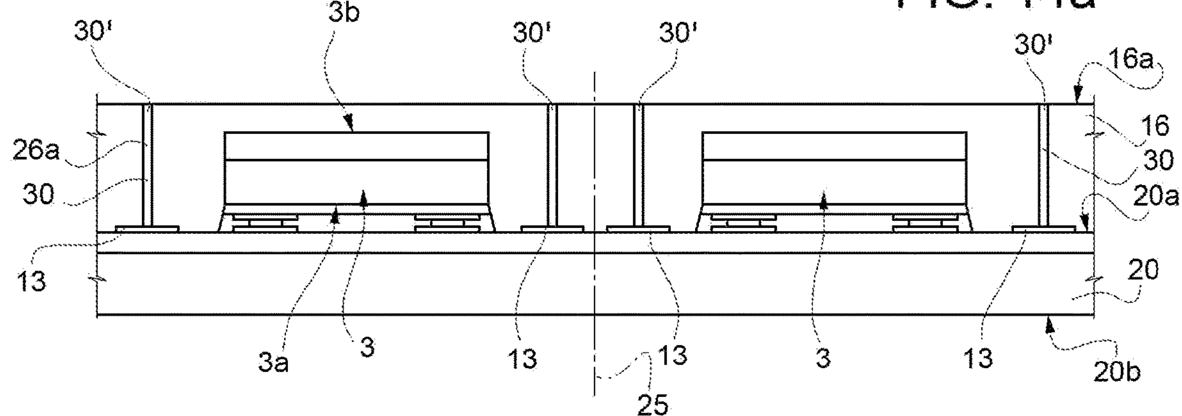

Afterwards, as shown in FIG. 14*b*, the mold compound 16 is formed, surrounding and coating the previously formed vertical connection structures 30 and covering the front surface 20*a* of the wafer 20, and, in this case, also the back surface 3*b* of the first dies 3.

In particular, the manufacturing process may envisage either covering a top portion 30' of the vertical connection structures 30, which is then exposed via a grinding step (or other step for removal of material) executed at the front surface 16*a* of the mold compound 16, or directly leaving exposed the top portion 30' of the vertical connection structures 30 during molding of the mold compound 16. In both cases, at the end of the manufacturing steps, top portion 30' of the vertical connection structures 30 is accessible at the front surface 16*a* of the mold compound 16.

Figure 14C:
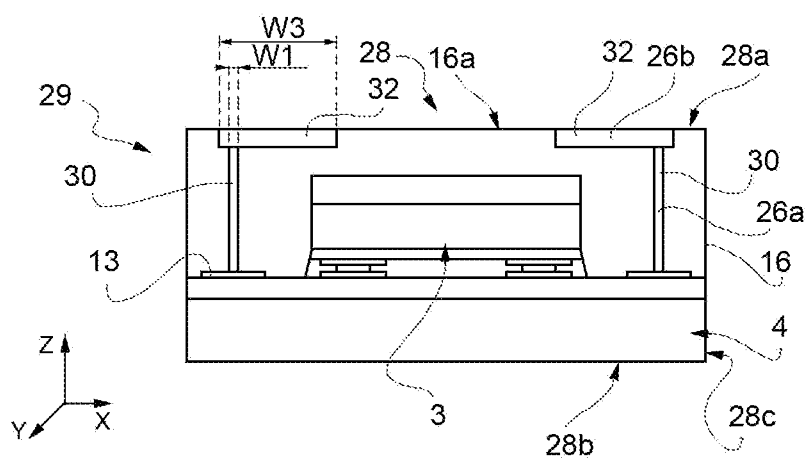

Afterwards, FIG. 14*c* (which already shows a singulated MEMS device 29), the external connection elements 32 are formed, coupled to the underlying vertical connections structures 30, as previously discussed in detail.

Figure 15:
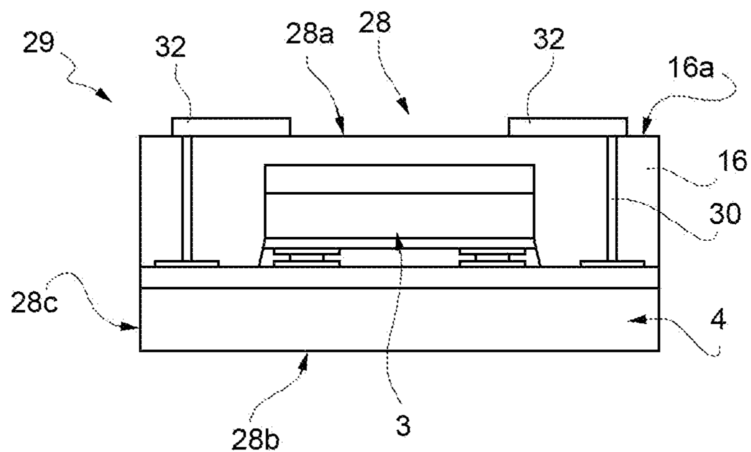
FIG. 15 shows, in cross section, a possible variation of the manufactured MEMS sensor device.

In particular, the external connection elements 32 are in this example made of a second conductive material 26*b*, an adhesive solderable material, and may be flush with the front surface 16*a* of the mold compound 16, as shown in the same FIG. 14*c*, or instead be embossed with respect to the same front surface 16*a*, as shown in FIG. 15.

Figure 16A:
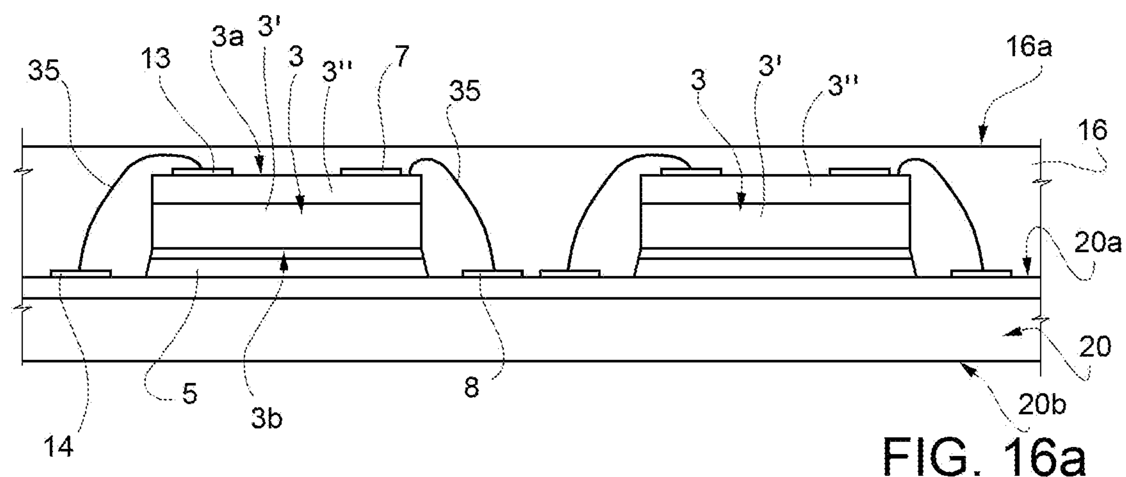

Still a further embodiment of the present solution is now discussed, starting from FIG. 16*a*, which shows a pair of adjacent first dies 3 attached on the front surface 20*a* of the wafer 20, in this case with the back surface 3*b* of the first dies 3 facing the top surface 20*a* of the wafer 20; the mold compound 16, in this case, coats and entirely covers the front surface 3*a* of the same first dies 3.

Moreover, electrical connections 35 are formed with electrical wires (shown schematically) between first pads 7 carried by the front surface 3*a* of the first dies 3 to second pads 8 carried by the front surface 20*a* of the wafer 20 (in order to electrically couple sensing structures S to electronic circuits A); further electrical wires 35 connect third pads 13 (designed to be electrically coupled to the outside of the package), in this case also carried by the front surface 3*a* of the first dies 3, and fourth pads 14 carried by the front surface 20*a* of the wafer 20.

As shown in FIG. 16*b*, a subsequent step of the manufacturing process again envisages formation of the holes 24, formed through a thickness of the mold compound 16, starting, however, from the front surface 3*a* of the first dies 3 (in this case being a top surface of the stack of the same first dies 3 with the underlying wafer 20), up to the front surface 16*a* of the mold compound 16. Hole 24 thus expose the third pads 13 arranged on the front surface 3*a* of the first dies 3.

Subsequently, as shown in FIG. 16*c*, the holes 24 are again filled with first conductive material 26*a* in order to form the vertical connection structures 30, which may be flush with or recessed from the front surface 16*a*, and are connected to the third pads 13.

As shown in FIG. 16*d* (and in the variant of FIG. 17), external electrical connection elements 32 are formed at the front surface 16*a* of the mold compound 16, accessible from the outside of the package 28 of the resulting MEMS device 29.

In this case, holes 24 are filled with first conductive material 26*a* forming the vertical connection structures 30, while the external electrical connection elements 32 are formed with the second, different, conductive material 26*b* (in particular, an adhesive solderable material); however, also in this case, use of a single conductive material 26, and adhesive solderable material, may be envisaged, as previously discussed in detail. Moreover, as shown in FIG. 17, also in this case, the external electrical connection elements 32 may have a different width, $W_3$, than the vertical connection structures 30, $W_1$.

Figure 18A:
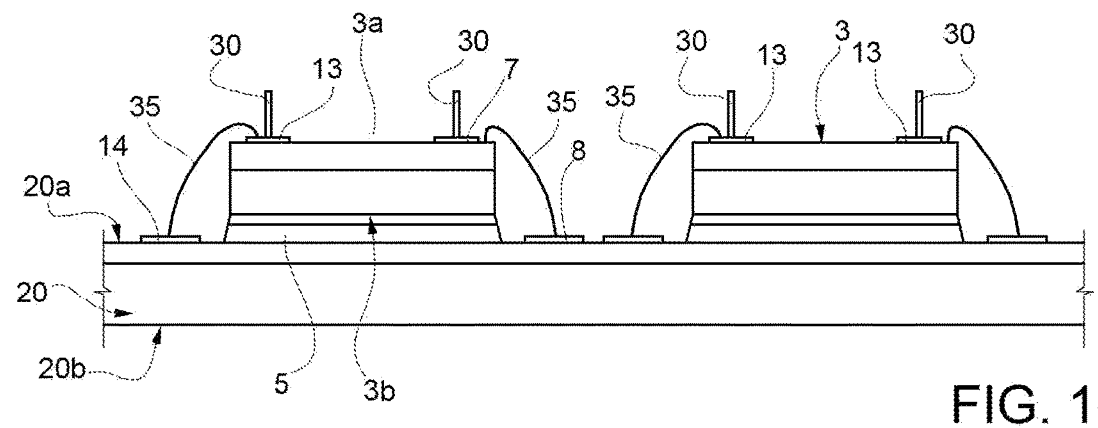
FIGS. 18*a*-18*c* show schematic cross sections of a MEMS sensor device in subsequent steps of a manufacturing process, according to yet another embodiment of the present solution.

As shown starting from FIG. 18*a*, yet another embodiment of the present solution envisages formation of the vertical connection structures 30, again starting from the front surface 3*a* of the first dies 3 (also in this case being a top surface of the stack of the same first dies 3 with the underlying wafer 20), but in this case before molding of the mold compound 16.

As previously discussed, vertical connection structures 30 may be formed as vertical wires, or stacked conductive bumps or pads, or using different, known, manufacturing steps.

Figure 18B:
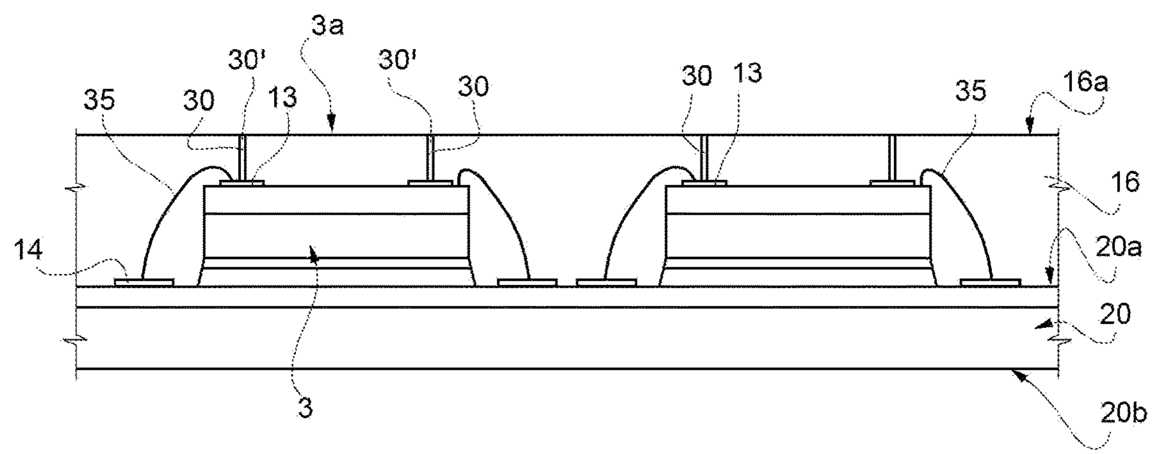

As shown in FIG. 18*b*, the mold compound 16 is then formed, coating and covering the first dies 3 and moreover the previously formed vertical connection structures 30, leaving exposed or covering a top portion 30' thereof (in the latter case a grinding, or similar process step, being required to expose the same top portion 30').

Figure 18C:
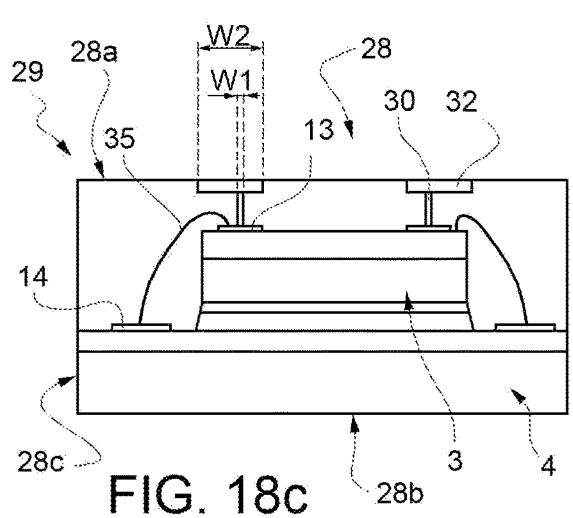
Figure 19:
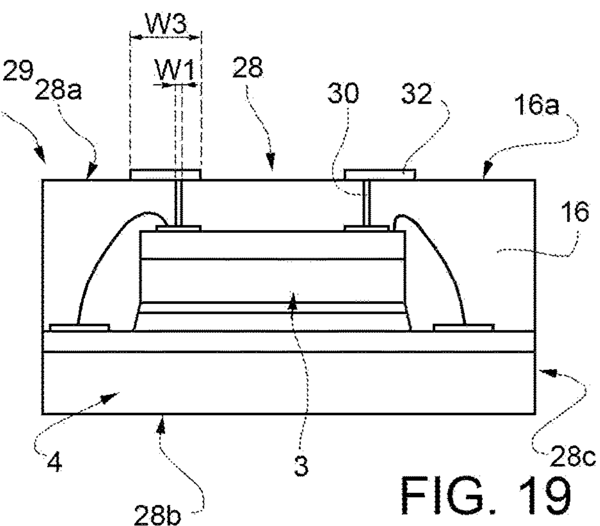
FIG. 19 shows, in cross section, a possible variation of the manufactured MEMS sensor device.

Afterwards, the external electrical connection elements 32 are formed at the front surface 16*a* of the mold compound 16, connected to the underlying vertical connection structures 30, being flush with the front surface 16*a* (as shown in FIG. 18*c*), or being arranged above the same front surface 16*a* (as shown in FIG. 19), and also possibly having a different, larger, width $W_3$ than the underlying vertical connections structures 30 (as shown in both FIGS. 18*c* and 19).

The advantages of the discussed solution are clear from the foregoing description.

In any case, it is once again emphasized that it allows to control the resulting size of the device package, in particular reducing a thickness, or vertical dimension thereof, at the same time providing a reliable and simple solution for the external electrical connections.

Overall, costs and complexity of the manufacturing process are reduced with respect to known solutions.

Moreover, the resulting structure is mechanical robust and allow to achieve desired electrical properties.

The above advantages allow the use of the proposed MEMS device 29 even when stringent design requirements are to be met as regards occupation of space, in terms of area and thickness, e.g., in portable or mobile electronic devices, such as, for example, portable computers, laptops, notebooks (including ultra-thin notebooks), PDAs, tablets, phablets, smartphones or wearable devices.

Finally, it is clear that modifications and variations may be made to what is described and illustrated herein, without thereby departing from the scope of the present disclosure.

In particular, it is underlined that various different materials could be used for the formation of the discussed MEMS device 29, in particular for the formation of the vertical connection structures 30 and external electrical connection elements 32, depending on the application and the specific design requirements.

In general, vertical connection structures 30 may be one of: a monolithic column; a vertical wire; a stack of conductive elements, again according to the specific design requirements (e.g., filling of the holes 24 with a monolithic column could lead to formation of voids and defects, while a stack of conductive elements could have less mechanical resistance).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS device package, comprising:

a first die of semiconductor material including a contact pad;

a second die of semiconductor material stacked on the first die, the second die being smaller than the first die, the second die having a contact pad;

a conductive wire coupled between the contact pad of the first die and the contact pad of the second die;

a mold compound on the second die and the first die; and a vertical connection structure on the contact pad of the second die, the vertical connection structure extending through the mold compound.

2. The MEMS device package according to claim 1, wherein a vertical connection structure includes a first conductive layer and a second conductive layer.

3. The MEMS device package according to claim 2, wherein an outer surface of the second conductive layer is coplanar with a surface of the mold compound.

4. The MEMS device package according to claim 2, wherein the second conductive material layer is solderable material.

5. The MEMS device package according to claim 1, further comprising an external connection element on the vertical connection structure.

6. The MEMS device package according to claim 5, wherein the external connection element is on the mold compound.

7. The MEMS device package according to claim 5, wherein the external connection element has a width that is greater than the vertical connection structure.

8. The MEMS device package according to claim 1, wherein the vertical connection structure is configured to couple the MEMS device package to an external device.

9. A semiconductor package, comprising:

a first die of semiconductor material coupled to a second die of semiconductor material, the first die including a contact pad and a MEMS device coupled to the contact pad, the second die including a contact pad and one or more electronic circuit coupled to the contact pad;

a conductive wire coupled to the contact pad of the first die and to the contact pad of the second die;

a mold compound on the first die and the second die; and a vertical connection structure on the contact pad of the first die and extending through the mold compound.

10. The semiconductor package according to claim 9, wherein the vertical connection structure includes first and second conductive layers.

11. The semiconductor package according to claim 10, wherein the second layer is an adhesive solderable material.

12. The semiconductor package according to claim 9, wherein the vertical connection structure is made of an adhesive solderable material.

13. The semiconductor package according to claim 9, wherein a surface of the second die forms an outer surface of the semiconductor package.

14. The semiconductor package according to claim 9, wherein the MEMS device is coupled to the one or more electronic circuit by the conductive wire.

15. The semiconductor package according to claim 9, wherein the vertical connection structure extends below a surface of the mold compound.

16. The semiconductor package according to claim 9, further comprising an external connection element on the vertical connection structure and on the mold compound.

17. A method of forming a semiconductor package, the method comprising:

coupling a first die to a second die in a stacked manner;

coupling a conductive wire to a contact pad of the first die and to a contact pad of the second die;

forming a mold compound on the first and second dice; and forming a vertical connection structure on the contact pad of the first die.

18. The method according to claim 17, wherein a surface of the mold compound, a surface of the second die, and a surface of the vertical connection structure form outer surfaces of the semiconductor package.

19. The method according to claim 17, wherein forming the vertical connection structure includes:

forming a recess in the mold compound at the contact pad of the first die; and providing an adhesive solderable material in the recess of the mold compound.

20. The method according to claim 17, wherein the vertical connection structure has a surface that is flush with a surface of the mold compound, the method further comprising forming an external connection element on the vertical connection structure and on the mold compound.

* * * * *